(12) United States Patent
Barabash et al.

(10) Patent No.: US 9,178,011 B2
(45) Date of Patent: Nov. 3, 2015

(54) DEPOSITION OF ANISOTROPIC DIELECTRIC LAYERS ORIENTATIONALLY MATCHED TO THE PHYSICALLY SEPARATED SUBSTRATE

(71) Applicant: Intermolecular, Inc., San Jose, CA (US)

(72) Inventors: Sergey Barabash, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/137,003

(22) Filed: Dec. 20, 2013

(65) Prior Publication Data

US 2014/0264747 A1 Sep. 18, 2014

Related U.S. Application Data

(60) Provisional application No. 61/779,170, filed on Mar. 13, 2013.

(51) Int. Cl.
| | |
|---|---|
| *H01L 49/02* | (2006.01) |
| *H01L 21/28* | (2006.01) |
| *H01L 27/108* | (2006.01) |
| *H01L 21/02* | (2006.01) |

(52) U.S. Cl.
CPC .......... *H01L 28/60* (2013.01); *H01L 21/02186* (2013.01); *H01L 21/02356* (2013.01); *H01L 21/28229* (2013.01); *H01L 27/1085* (2013.01); *H01L 2924/05341* (2013.01); *H01L 2924/10671* (2013.01)

(58) Field of Classification Search
CPC .................... H01L 21/02356; H01L 21/02186; H01L 21/28229; H01L 27/1085; H01L 28/40; H01L 2924/05341; H01L 2924/10671
See application file for complete search history.

(56) References Cited

U.S. PATENT DOCUMENTS

| | | | |
|---|---|---|---|
| 6,156,606 A | 12/2000 | Michaelis | |
| 7,696,574 B2 | 4/2010 | Zhu | |
| 8,183,659 B2 | 5/2012 | Kabir | |
| 8,198,168 B2 | 6/2012 | Tanioku | |
| 2010/0135937 A1 | 6/2010 | O'Brien et al. | |
| 2011/0204475 A1 | 8/2011 | Rui et al. | |
| 2012/0119327 A1* | 5/2012 | Kwon et al. | 257/532 |
| 2012/0171839 A1* | 7/2012 | Chen et al. | 438/396 |
| 2012/0183728 A1 | 7/2012 | Wang et al. | |
| 2012/0199944 A1 | 8/2012 | Huang et al. | |

OTHER PUBLICATIONS

International Search Report and Written Opinion for PCT Application No. PCT/US2014/026621 mailed on Jul. 28, 2014.
Gao et al.; Effect of Substrate Pretreatment on Controllable Growth of TiO2 Nanorod Arrays; 2012; ScienceDirect; Elsevier; J. Mater. Sci. Technol., pp. 577-586.

* cited by examiner

*Primary Examiner* — Kevin Parendo

(57) ABSTRACT

A dielectric layer can achieve a crystallography orientation similar to a base dielectric layer with a conductive layer disposed between the two dielectric layers. By providing a conductive layer having similar crystal structure and lattice parameters with the base dielectric layer, the crystallography orientation can be carried from the base dielectric layer, across the conductive layer to affect the dielectric layer. The process can be used to form capacitor structure for anisotropic dielectric materials, along the direction of high dielectric constant.

20 Claims, 12 Drawing Sheets

Forming a first dielectric layer over a substrate, wherein the first dielectric layer comprises a dominant crystallography orientation along a lateral direction
600

Patterning the first dielectric layer to form a trench having two parallel side surfaces, wherein the parallel side surfaces are perpendicular to the lateral direction
610

Forming a first conductive layer in the trench, wherein one surface of the first conductive layer is in contact with the first dielectric layer, wherein the conductive layer comprises similar crystal structure and similar lattice constant as the first dielectric layer
620

Forming a second dielectric layer in the trench, wherein one surface of the second dielectric layer is in contact with the first conductive layer, wherein the second dielectric layer comprises a same material as the first dielectric layer, wherein the second dielectric layer comprises a same crystallography orientation as the first dielectric layer
630

Forming a second conductive layer in the trench
640

Forming a third conductive layer, wherein the third conductive layer is in contact with an opposite surface of the one surface of the first conductive layer
650

FIG. 6

Forming a TiO$_2$ nanorod layer, wherein the nanorods comprises a dominant crystallography orientation along a lateral direction
900

Forming a first dielectric layer over a substrate, wherein the first dielectric layer comprises a TiO$_2$ material, wherein the first dielectric layer comprises a same dominant crystallography orientation as the nanorod layer
910

Patterning the first dielectric layer to form a trench having two parallel side surfaces, wherein the parallel side surfaces are perpendicular to the lateral direction
920

Forming a first conductive layer in the trench, wherein one surface of the first conductive layer is in contact with the first dielectric layer, wherein the conductive layer comprises VO$_2$, NbO$_2$, TaO$_2$, CrO$_2$, MoO$_2$, MnO$_2$, RuO$_2$, OsO$_2$, RhO$_2$, IrO$_2$, PtO$_2$, or anycombination thereof
930

Forming a second dielectric layer in the trench, wherein one surface of the second dielectric layer is in contact with the first conductive layer, wherein the second dielectric layer comprises a same material as the first dielectric layer, wherein the second dielectric layer comprises a same crystallography orientation as the first dielectric layer
940

Forming a second conductive layer in the trench
950

FIG. 9

DEPOSITION OF ANISOTROPIC DIELECTRIC LAYERS ORIENTATIONALLY MATCHED TO THE PHYSICALLY SEPARATED SUBSTRATE

CROSS-REFERENCE TO RELATED APPLICATIONS

This application claims priority to U.S. Provisional Patent Application No. 61/779,170 entitled "Materials for DRAM applications" filed on Mar. 13, 2013, which is incorporated herein by reference. This application is related to application Ser. No. 13/721,606, entitled "Deposition of rutile films with very high dielectric constant", which is incorporated herein by reference.

FIELD OF THE INVENTION

This invention relates generally to capacitor elements, and more particularly, to methods for forming capacitor elements in memory devices.

BACKGROUND

Materials with high dielectric constant are desired for many modern electronics applications that involve a capacitor-like element, including DRAM and transistor gates. High dielectric constant values can correlate with small band gap, thus the requirement that the dielectric has a sufficient band gap (typically >~3 eV) makes it difficult to increase dielectric constant by purely chemical means.

Rutile materials, such as rutile titanium dioxide ($TiO_2$), have been used as dielectric materials for high dielectric constant applications. $TiO_2$-based dielectric materials have the potential to exhibit relatively high dielectric constant values. However, the effective dielectric constant, $k_{eff}$, typically remains below 100.0 (e.g., 80-90).

However, high dielectric constant values have been discovered for $TiO_2$ single crystals when measured along a tetragonal axis (i.e. along the [001] direction). For example, a single crystal rutile $TiO_2$ material at room temperature, and frequencies in the $10^2 \ldots 10^6$ Hz range, has been found to exhibit dielectric constant values of $\kappa_\perp = 86$ and $\kappa_\parallel = 170$, when the field is applied respectively perpendicularly and parallel to [001].

As such, the effective dielectric constant values exhibited in semiconductor devices suggest that for a typical modern semiconductor manufacturing sequence, the materials crystallize in a manner such that the effective dielectric constant is reflected by the smaller dielectric constant $\kappa_\perp$ value. At best, a polycrystalline rutile film with randomly oriented crystallites may be utilized, in which case, the effective dielectric constant $\kappa_{eff}$ value is an average of $\kappa_\perp$ and $\kappa_\parallel$ with a twice larger weight given to the smaller dielectric constant $\kappa_\perp$ value. The exact form of averaging that describes the effective dielectric constant value, $\kappa_{eff}$, depends on crystal microstructure, but an approximate value can be calculated using the effective medium approximation, which for randomly oriented crystallites in rutile $TiO_2$ can yield $\kappa_{eff} \approx 110$. In fact, the actual $\kappa_{eff}$ values of polycrystalline rutile $TiO_2$ with randomly oriented crystallites may be lower than 110 due to imperfections present in the $TiO_2$ polycrystal.

Therefore, there is a need to increase the effective dielectric constant values of dielectric materials within semiconductor-based capacitive devices.

SUMMARY

In some embodiments, methods are provided to form an oriented dielectric layer separated from the seed layer by another layer, such as an electrode layer. For example, an electrode layer can be formed on a seed layer which has a dominant preferred orientation. A dielectric layer then can be formed on the electrode layer, and still having the preferred orientation of the seed layer. The methods can preserve the templating property of a seed layer through an intermediate electrode layer, e.g., growing a dielectric layer on an electrode layer but the dielectric layer still have the same preferred direction of a seed layer under the electrode layer.

In some embodiments, the methods can allow the formation of a capacitor structure. A seed layer can be formed, which can serve as a template for growing a dielectric layer having a crystallographic orientation of the highest dielectric constant substantially along the direction of the electric fields that can develop when the capacitor structure is operated. A first electrode layer can be formed on the seed layer. The first electrode layer can be operable as an electrode for the capacitor structure. A dielectric layer can be formed on the first electrode according to the present methods to obtain the crystallographic orientation of highest dielectric constant from the seed layer. A second electrode layer can be formed on the dielectric layer. The second electrode layer can be operable as another electrode for the capacitor structure, which can have high capacitance value due to the orientation of the dielectric layer.

In some embodiments, the electrode layer can have crystal structure and lattice parameters that match, such as match epitaxially, to the seed layer or to the subsequently deposited dielectric. With similar crystal structure and lattice parameters, the electrode layer can preserve the templating function of the seed layer, thus can allow the growth of the preferred orientation of the dielectric layer.

In some embodiments, a $TiO_2$ nanorod seed layer having tetragonal [001] direction can be formed on a substrate. A first $TiO_2$ layer can be deposited on the seed layer, thus having the same crystallography orientation as the nanorod layer. A trench having two parallel side surfaces can be patterned on the dielectric layer. A first conductive layer can be formed in the trench, to be operable as a first electrode for a capacitor structure. The first conductive layer can include material having crystal structure and lattice parameters matching that of $TiO_2$, such as $RuO_2$, $MoO_2$, $VO_2$, $NbO_2$, $TaO_2$, $CrO_2$, $MnO_2$, $OsO_2$, $RhO_2$, $IrO_2$, $PtO_2$, or any combination thereof. A second $TiO_2$ dielectric layer can be formed in the trench and contacting the first conductive layer. The second dielectric layer can have the preferred orientation of the first dielectric layer, which is preserved and transferred through the first conductive layer. A second conductive layer can be formed in the trench and contacting the second dielectric layer, operable as a second electrode for the capacitor structure.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 6 illustrates a flowchart for forming a device according to some embodiments.

FIG. 9 illustrates a flowchart for forming a device according to some embodiments.

DETAILED DESCRIPTION

Figure 1:
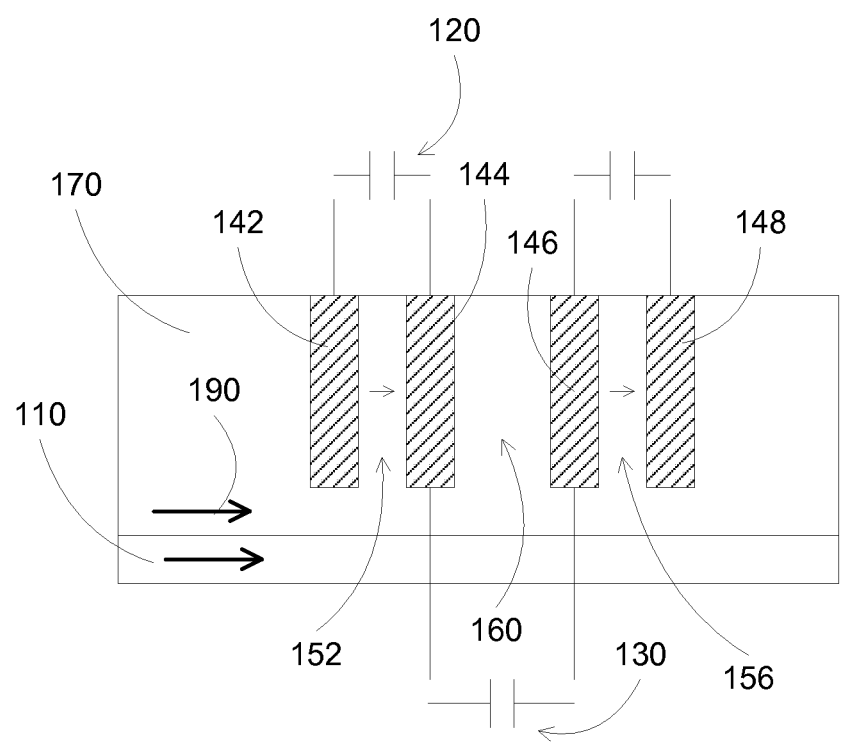
FIG. 1 illustrates a configuration for forming capacitor structures having the dielectric layer formed directly on a seed layer.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, anisotropic dielectric materials are prepared and processed to maximize the dielectric constant along the direction of the applied field. The anisotropic dielectric structures can be used in semiconductor devices such as capacitor structures, memory structures and transistor structures.

In some embodiments, methods, and devices fabricated from methods, to form structures having high dielectric constant dielectric layers are provided. The dielectric layers can include anisotropic materials that can have different dielectric constant in different directions. For example, rutile materials, such as $TiO_2$, can exhibit higher dielectric constant (e.g., 170) along the tetragonal axis of [001] direction, and lower dielectric constant (e.g., 86) along directions perpendicular to the tetragonal axis. The methods can align the dielectric layer so that the electric field can be aligned with the direction of the highest dielectric permittivity. The structures can include capacitor devices, memory devices, and transistor devices such as FinFET transistors.

In some embodiments, the dielectric layer can be deposited on a seed layer, which serves as a template for the growing of the dielectric material having the direction of the highest dielectric permittivity. In some embodiments, the seed layer can have a same material composition as the dielectric layer, and can be specially prepared to allow the optimal growth of the dielectric layer.

In some embodiments, the dielectric layer needs to be formed on an electrode, instead of on a dielectric seed layer, on a seed layer having a same composition and structure as that of the dielectric layer. For example, a capacitor structure can include a dielectric layer disposed between two electrodes.

In some embodiments, the seed layer can be oriented to allow forming capacitor structure having high capacitance value. Details of the seed layer orientation process can be found in co-pending application Ser. No. 13/721,606, which is hereby incorporated by reference.

In some embodiments, the present invention discloses methods to form capacitor structure having high capacitance value with small size and better seed layer uniformity, which can lead to better dielectric properties. Further, better reliability can be achieve with potentially minimum or no damage to nearby layers such as the electrodes.

In some embodiments, methods are provided to allow a seed layer to affect a layer that is formed physically separated from the seed layer. For example, a seed layer can be provided that has a preferred orientation. A first conductive layer, which is operable as an electrode for a capacitor structure, is then formed on the seed layer. A dielectric layer, which is operable as a dielectric layer for the capacitor structure, is then formed on the first conductive layer. A second conductive layer, which is operable as another electrode for the capacitor structure, is then formed on the dielectric layer.

In some embodiments, provided are methods for the seed layer to act as a template for the growing of the dielectric layer, even though the dielectric layer is physically separated from the seed layer, e.g., separated by the first conductive layer which is operable as an electrode. Thus the dielectric layer can preserve the crystallographic orientation of the seed layer, even though the dielectric layer is formed on the conductive layer. In some embodiments, the methods can allow the formation of a capacitor structure that can have the highest capacitance value due to the orientation of the dielectric layer.

In some embodiments, the electrode layer can have crystal structure and lattice parameters that match epitaxially to the seed layer. With similar crystal structure and lattice parameters, the electrode layer can preserve the templating function of the seed layer, thus can allow the growth of the preferred orientation of the dielectric layer. The matching can be higher than 80% matching, such as higher than 90% or even 95% matching. The matching percentage can be determined by the success of the dielectric layer having the preferred orientation of the seed layer.

In some embodiments, the seed layer can include $TiO_2$. The conductive layer can include $RuO_2$, $MoO_2$, $VO_2$, $NbO_2$, $TaO_2$, $CrO_2$, $MnO_2$, $OsO_2$, $RhO_2$, $IrO_2$, $PtO_2$, or any combination thereof. For example, the seed layer can have a rutile (or rutile-based) structure of $TiO_2$, and the conductive layer can also have the rutile-based structure of $RuO_2$ or $MoO_2$. Alternatively, the conductive layer can be some of the alloys or pure compounds between $RuO_2$, $MoO_2$, $VO_2$, $NbO_2$, $TaO_2$, $CrO_2$, $MnO_2$, $OsO_2$, $RhO_2$, $IrO_2$, $PtO_2$.

Some of high-κ materials exhibit anisotropic properties. Oftentimes (e.g. for DRAM and transistor gate applications), it may be desirable that κ is maximized by orienting the anisotropic material so that the electric field is fully or partially aligned with the direction of the highest dielectric permittivity, which can be called the "optimal direction".

For example, $TiO_2$ single crystal can have different dielectric constant values when measured in different directions. When measured along a tetragonal axis (e.g., along the [001] direction), the dielectric constant value is 170 as compared to a value of 86 when measured in a perpendicular direction.

In some embodiments, capacitor structures can be configured to form dielectric layer directly on a seed layer to preserve the crystallography orientation.

FIG. 1 illustrates a configuration for forming capacitor structures having the dielectric layer formed directly on a seed layer. A seed layer 110 can be formed, for example, on a substrate (not shown). The seed layer can have a preferred orientation 190, for example, an orientation that can provide the highest dielectric constant. A dielectric layer 170 can be formed directly on the seed layer 110, thus can also have the same preferred orientation 190. Trenches can be etched in the dielectric layer 170, and then filled with a conductive material to form electrodes for a capacitor structure. For example, two electrodes 142 and 144 can be disposed next to each other and separated by the portion 152 of the dielectric layer 170. Since the dielectric portion 152 has the orientation of the highest dielectric constant, the capacitance 120 of the capacitor structure is maximized. Multiple capacitor structures can be formed, for example, a neighbor capacitor structure having dielectric portion 156 between two electrodes 146 and 148. Further details can be found on co-pending application Ser. No. 13/721,606, which is incorporated herein by reference.

In some embodiments, this configuration can generate parasitic capacitance between neighboring units. For example, electrode 144 and electrode 146 of two neighbor capacitor structures can form a parasitic capacitance 130 through the dielectric portion 160 between the neighbor capacitors. Thus for this configuration, parasitic capacitance will need to be considered, for example, by applying same potentials to nearby electrodes, e.g., electrodes 144 and 146.

In some embodiments, the parasitic capacitive coupling can be nearly eliminated by surrounding one of the electrodes by the second electrode and keeping all outer electrodes at the same potential (e.g. grounding the outer electrodes).

Figure 2A:
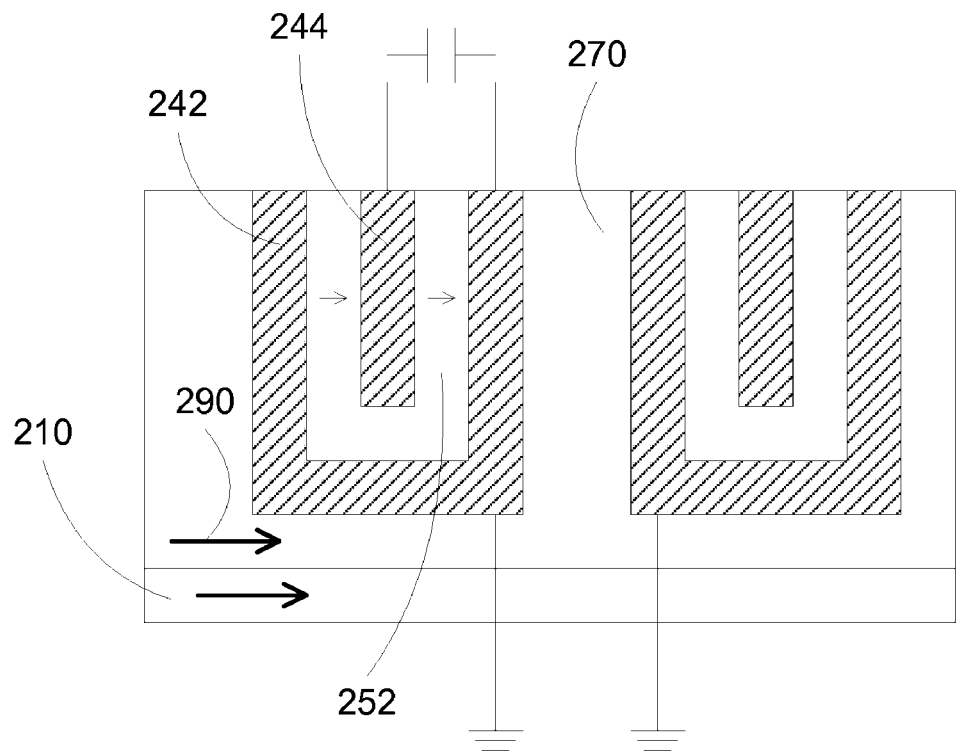
FIG. 2A illustrates a configuration for capacitor structures having surrounding outer electrodes according to some embodiments.

FIG. 2A illustrates a configuration for capacitor structures having surrounding outer electrodes according to some embodiments. A seed layer 210 can be formed, for example, on a substrate (not shown). The seed layer can have a preferred orientation 290, for example, an orientation that can provide the highest dielectric constant. A dielectric layer 270 can be formed directly on the seed layer 210, thus can also have the same preferred orientation 290. Trenches can be etched in the dielectric layer 270, and then coated with a conductive layer 242 to form the outer electrode for a capacitor structure. A dielectric layer 252 then can be formed interfacing the conductive layer 242 to form the dielectric portion of the capacitor structure. Another conductive layer 242 can be formed, either filling the trench or forming a layer, to form the inner electrode for the capacitor structure.

In this configuration, the dielectric layer is physically separated from the template layer 270 (e.g., the layer 270 serves as a seed layer for the growth of the preferred orientation 290 on the dielectric layer 252). Thus, in some embodiments, the conductive layer 242 is selected to have matching crystal structure and lattice parameters with the seed layer 210 or the dielectric layer 270. The matching can be more than 80% matching, or more than 90 or 95% matching.

In some embodiments, other layers instead of the conductive layer, e.g., dielectric or semiconductor layers, can be used as the separation layer. The separation layer can have matching crystal structure and lattice parameters with the seed layer, e.g., the crystal structure and lattice parameters of the conductive layer 242 can match epitaxially to the surface of the oriented dielectric 270.

In some embodiments, after depositing the initial dielectric layer 270 of oriented dielectric, additional layers (e.g. electrode layer 242) are deposited and crystallized. The initial layer 270 serves as a crystallization seed, promoting the crystallization of the additional layers 242. Then subsequent layers 252 of the same dielectric (or other epitaxially compatible layers of other device elements) are deposited, and the already deposited layers 242 in turn serve as crystallization seeds. As a result, the subsequent dielectric layers 252 maintain the crystal orientation of the initial dielectric layer 270, despite being separated by the additional device elements 242.

In some embodiments, the initial dielectric layer 270 can be rutile $TiO_2$ crystallized on top of rutile $TiO_2$ nanorod layer 210. After the electrode trenches are etched, a layer 242 of conducting material with rutile (or rutile-based) structure and with sufficient lattice matching to $TiO_2$ is deposited. The layer 242 can be 1 nm to 30 nm thick. The conducting rutile-based material could be $RuO_2$, $MoO_2$, or could also be some of the alloys or pure compounds between $VO_2$, $NbO_2$, $TaO_2$, $CrO_2$, $MoO_2$, $MnO_2$, $RuO_2$, $OsO_2$, $RhO_2$, $IrO_2$, and $PtO_2$. After the rutile material 242 is crystallized (which may require about 10 min thermal treatment at 300- 400 C, depending on the material and the deposition technique), a $TiO_2$ layer 252 is deposited on top of the conducting rutile layer 242. The thickness of the $TiO_2$ layer 252 can be 3 nm to 15 nm. The $TiO_2$ layer 252 can be annealed for crystallizing. After crystallization, the tetragonal axis of this dielectric layer 252 is still matched to the original nanorod layer 210. Finally, the second electrode 244 is deposited. The geometry of the etched/deposited structures is chosen so that the electric field applied to the dielectric layer between any electrodes is parallel to the tetragonal axis for the larger part of the dielectric layer.

The second electrode 244 does not need to be rutile and may be deposited by a variety of techniques. Since the conductivity of the conducting rutiles is not particularly high, it is desirable to use a highly-conductive material (e.g. Pt, Al, or TiN) for the second electrode 244. Furthermore, after the rutile dielectric 252 has been deposited and crystallized on top of the electrode 242, additional highly conducting electrodes may be deposited into trenches etched outside the vertical walls and/or through the vertical sections of the electrode 242 to improve the conductivity of the electrode 242.

The capacitor structure can provide that the current flows with high density and via a large distance along the electrode primarily inside the highly conductive electrodes. The conducting rutile electrode needs to transmit only low current density via a short distance, minimizing the voltage drop and the power dissipation.

Figure 2B:
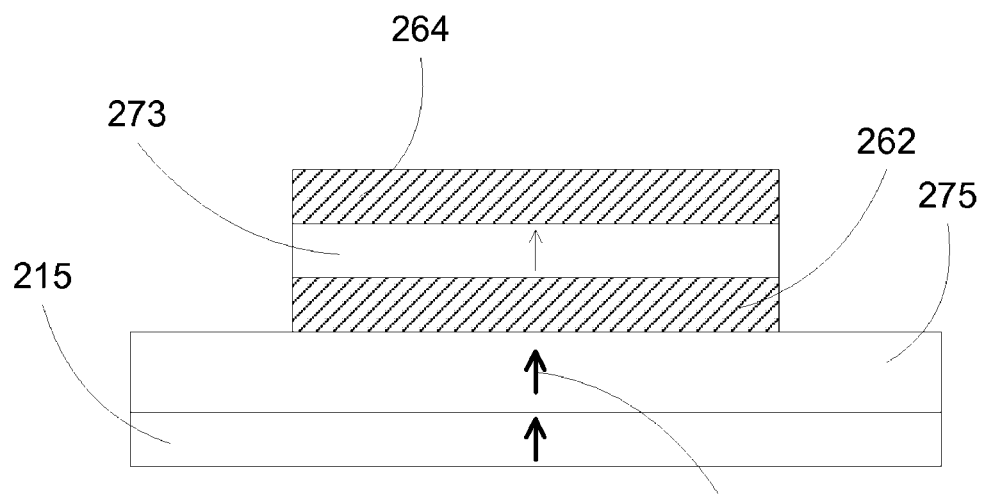
FIG. 2B illustrates another configuration for a capacitor structure according to some embodiments.

FIG. 2B illustrates another configuration for a capacitor structure according to some embodiments. A seed layer 215 can be formed, for example, on a substrate (not shown). The seed layer can have a preferred orientation 295, for example, an orientation that can provide the highest dielectric constant. A dielectric layer 275 can be formed directly on the seed layer 215, thus can also have the same preferred orientation 295. A conductive layer 262 can be formed on the dielectric layer 275 to form the bottom electrode for a capacitor structure. A dielectric layer 273 then can be formed interfacing the conductive layer 262 to form the dielectric portion of the capacitor structure. Another conductive layer 264 can be formed on the dielectric layer 273, to form the top electrode for the capacitor structure.

In this configuration, the dielectric layer 273 is physically separated from the template layer 275 (e.g., the layer 275 serves as a seed layer for the growth of the preferred orientation 295 on the dielectric layer 273). Thus, in some embodiments, the conductive layer 262 is selected to have matching crystal structure and lattice parameters with the seed layer 215 or the dielectric layer 275.

In some embodiments, methods are provided to allow a dielectric layer to achieve a crystallographic orientation similar to a base dielectric layer that is separated by a conductive layer. By providing a conductive layer having similar crystal structure and lattice parameters with the base dielectric layer, the crystallographic orientation can be carried from the base dielectric layer, across the conductive layer to affect the dielectric layer.

Figure 3A:
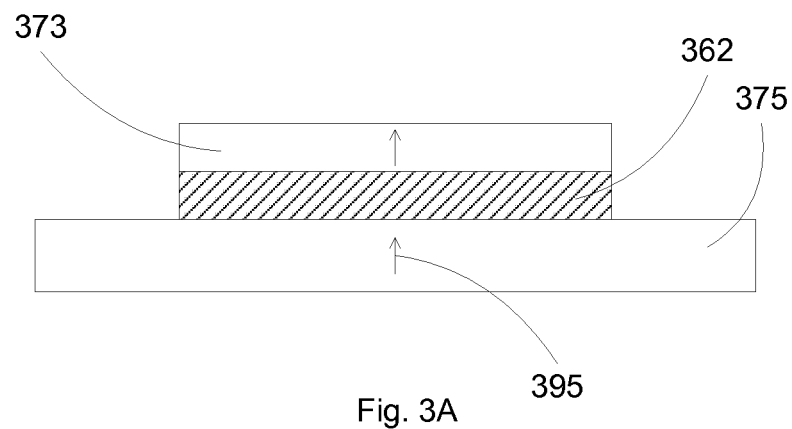
FIGS. 3A-3B illustrate configurations of a dielectric templating process across a conductive layer according to some embodiments.
Figure 3B:
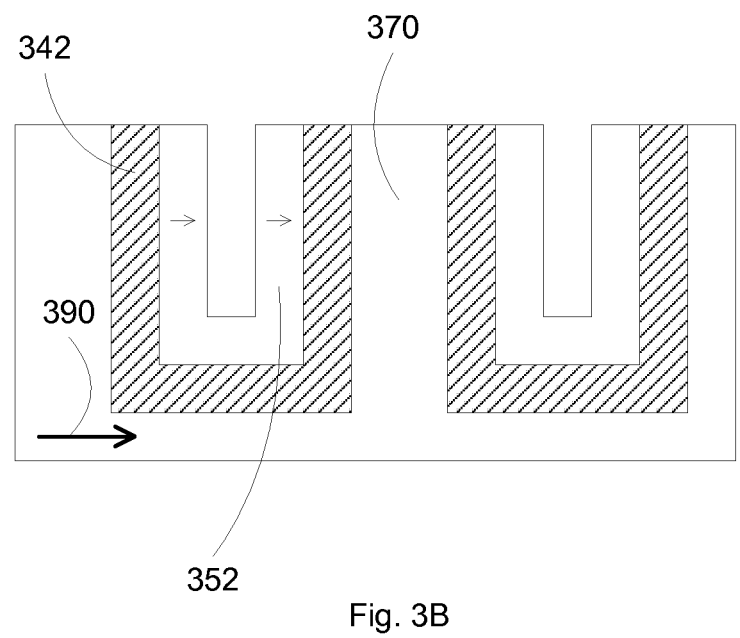

FIGS. 3A-3B illustrate configurations of a dielectric templating process across a conductive layer according to some embodiments. In FIG. 3A, a dielectric layer 375 can be formed, for example, on a substrate (not shown). The dielectric layer can have a preferred orientation 395, for example, an orientation that can provide the highest dielectric constant. The preferred orientation can be perpendicular to a lateral surface of the dielectric layer 375, e.g., a normal direction of the dielectric layer 375. A conductive layer 362 can be formed on the dielectric layer 375. A second dielectric layer 373 then can be formed interfacing the conductive layer 362. In this configuration, the dielectric layer 373 is physically separated from the template layer 375. Thus, in some embodiments, the conductive layer 362 is selected to have matching crystal structure and lattice parameters with the dielectric layer 375.

In FIG. 3B, a dielectric layer 370 can be formed, for example, on a substrate (not shown). The dielectric layer can have a preferred orientation 390, for example, an orientation that can provide the highest dielectric constant. The preferred orientation can be parallel to a lateral surface of the dielectric layer 370, e.g., along the surface of the dielectric layer 370. Trenches can be etched in the dielectric layer 370, and then coated with a conductive layer 342. A dielectric layer 352 then can be formed interfacing the conductive layer 342.

In this configuration, the dielectric layer is physically separated from the template layer 370. Thus, in some embodiments, the conductive layer 342 is selected to have matching crystal structure and lattice parameters with the seed layer 310 or the dielectric layer 370.

In some embodiments, methods are provided to form an oriented dielectric layer separated from the seed layer by another layer, such as an electrode layer. The methods can include forming a first dielectric layer having a preferred orientation, followed by a conductive layer having crystal structure and lattice parameters matching with those of the first dielectric layer. A second dielectric layer can be formed on the conductive layer, and can have the preferred orientation of the first dielectric layer.

Figure 4:
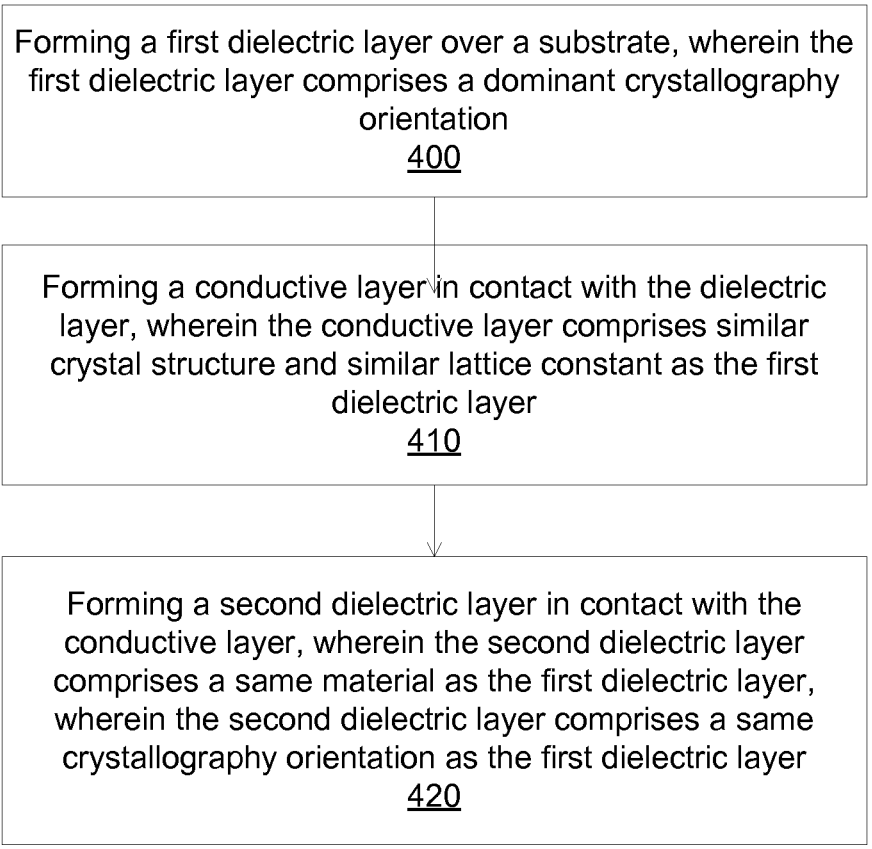
FIG. 4 illustrates a flowchart for forming a device according to some embodiments.

FIG. 4 illustrates a flowchart for forming a device according to some embodiments. The flowchart is a general description of techniques used to form the devices described above. Although certain processing techniques and specifications are described, it is understood that various other techniques and modifications of the techniques described herein may also be used.

In operation 400, a first dielectric layer is formed on a substrate. The first dielectric layer can have a dominant crystallographic orientation. In operation 410, a conductive layer can be formed on the first dielectric layer. The conductive layer can have a similar crystal structure and lattice parameters as the first dielectric layer. The similarity can be less than 20% difference, or can be less than 10 or 5% difference.

In operation 420, a second dielectric layer can be formed on the conductive layer. The second dielectric layer can have the same material as the first dielectric layer. The second dielectric layer can have the same dominant crystallography orientation as the first dielectric layer.

In some embodiments, an anneal can be performed after forming the first dielectric layer, the conductive layer, and/or the second dielectric layer. For example, the layers can be formed by one or more sequences of deposition and anneal. The deposition can include an atomic layer deposition (ALD) process, or a chemical vapor deposition (CVD) process. The deposited layers can be annealed, for example, in temperatures between 300 and 450 C, such as to crystallize or recrystallize the deposited layers.

Figure 5A:
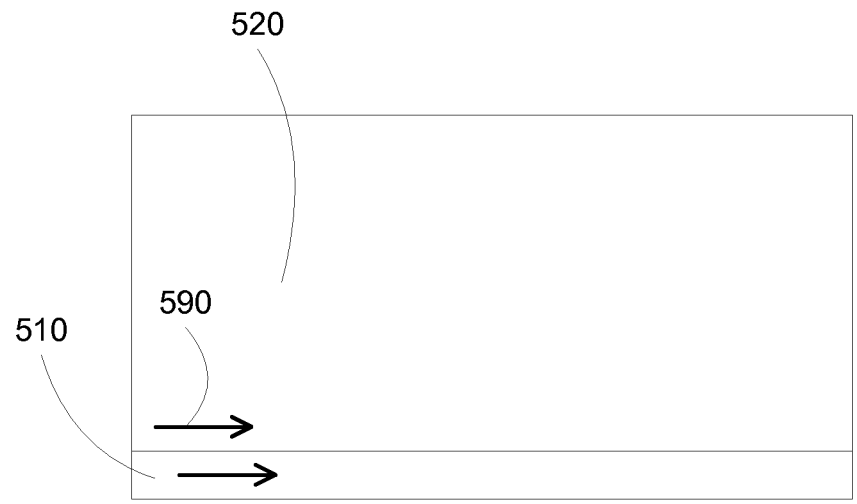
FIGS. 5A-5F illustrate a process sequence for forming a capacitor structure according to some embodiments.

FIGS. 5A-5F illustrate a process sequence for forming a capacitor structure according to some embodiments. In FIG. 5A, a dielectric 520 can be formed on a substrate 510. In some embodiments, the substrate can be a semiconductor substrate, such as a silicon substrate, a germanium substrate, a silicon-germanium substrate, or any other substrates having a layer of semiconductor layer. In some embodiments, the substrate can be a dielectric substrate, such as an amorphous silicon dioxide substrate. In some embodiments, the substrate can include a seed layer having a high dielectric constant direction 590, such as along a [001] direction of a rutile $TiO_2$ seed layer, which is parallel to the substrate surface.

The dielectric layer 520 can also have the same crystallographic orientation 590 as the substrate, for example, by using a seed layer on the substrate as a template for growing the same crystallographic orientation on the dielectric layer 520.

The dielectric layer 520 can be deposited on the substrate, for example, by ALD, CVD, plasma enhanced atomic layer deposition (PEALD), plasma enhanced chemical vapor deposition (PECVD), or any other deposition technique. The dielectric layer 520 can be optional annealed, for example, at temperature between 400 and 450 C to crystallize (or recrystallize) the layer. Multiple sequences of deposition and anneal can also be performed, for example, to facilitate the forming of the crystallized layer while minimizing the likelihood of nucleating new crystalline seeds structurally independent of the layer 520. For example, thin layer, e.g., 50-200 nm, can be deposited and annealed, before another layer can be deposited and annealed, to achieve a layer with any desirable thickness.

Figure 5B:
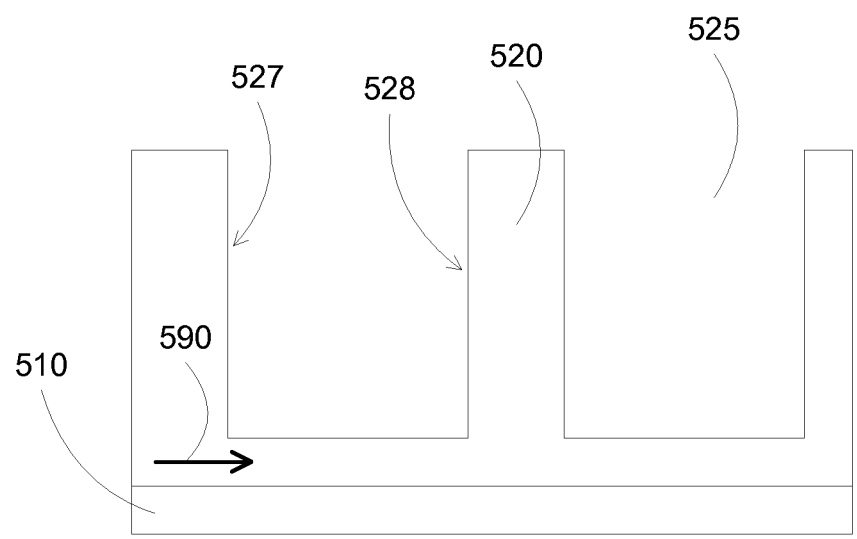

In FIG. 5B, the layer 520 is patterned to form trenches 525 having side surfaces 527 and 528 of high dielectric constant, e.g., a surface that an electric field normal to that surface can experience the high dielectric constant characteristic of the layer.

Figure 5C:
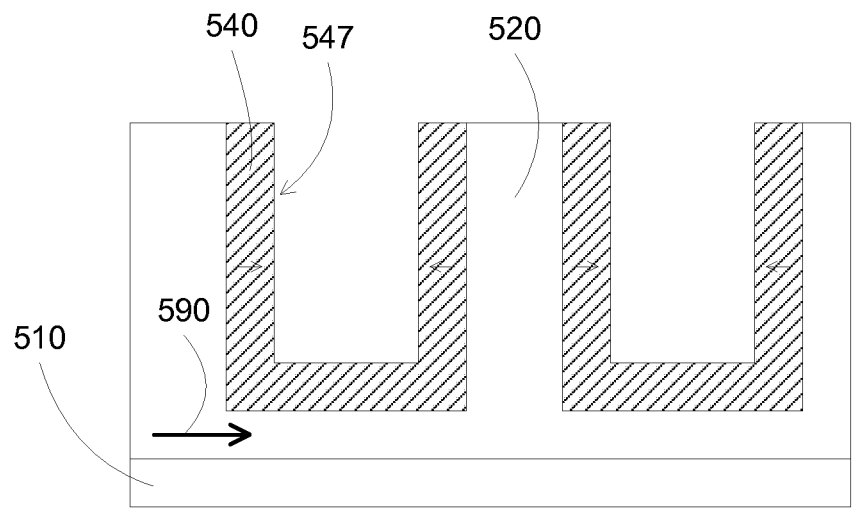

In FIG. 5C, a conductive layer 540 can be formed in the trenches 525, contacting the side surfaces 527 and 538. The conductive layer 540 can have similar crystal structure and lattice parameters as the dielectric layer 520, so that the conductive layer 540 can have side surfaces 547 having similar templating functionality as the dielectric layer 520.

The conductive layer 540 can be deposited, for example, by ALD, CVD, PEALD, PECVD, or any other deposition technique. The conductive layer 520 can be optional annealed, for example, at temperature between 400 and 450 C to crystallize (or recrystallize) the layer.

Figure 5D:
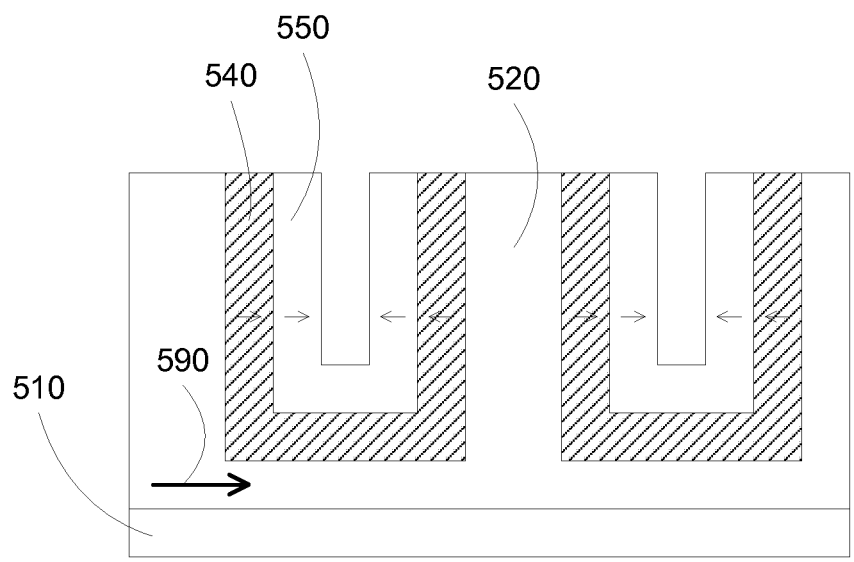

In FIG. 5D, a second dielectric layer 550 can be formed in the trenches 525, contacting the side surfaces 547 of the conductive layer 540. The second dielectric layer 550 can have the same composition as the dielectric layer 520. The second dielectric layer 550 can be formed under conditions to use the conductive layer surface 547 as a template for forming the same crystallographic orientation as the first dielectric layer 520.

The second dielectric layer 550 can be deposited, for example, by ALD, CVD, PEALD, PECVD, or any other deposition technique. The second dielectric layer 550 can be optional annealed, for example, at temperature between 400 and 450 C to crystallize (or recrystallize) the layer.

Figure 5E:
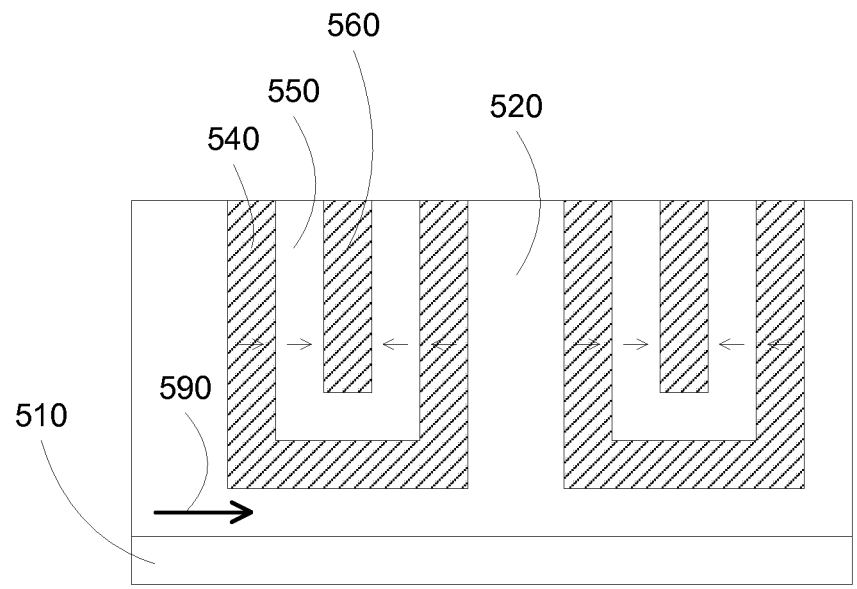

In FIG. 5E, a second conductive layer 560 can be formed in the trenches 525, for example, filing in the trenches. The second conductive layer 560 can have high conductivity, such as Al, Pt, TiN, or any other high conductivity materials such as metals or alloys. The second conductive layer 560 can be deposited, for example, by ALD, CVD, PEALD, PECVD, or any other deposition technique.

Figure 5F:
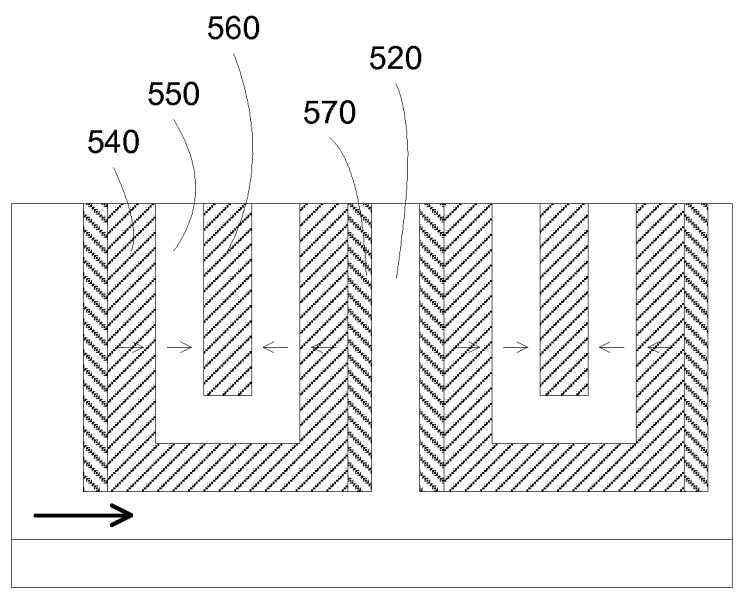

In FIG. 5F, optional third conductive layer 570 can be formed near the first conductive layer 540, for example, to increase the conductivity of the conductive layer 540. The dielectric layer 520 can be patterned, e.g., etched in areas near the conductive layer 540, and the third conductive layer 570 can be deposited in the pattern. As shown, the third conductive layer 570 can be formed separately between two neighbor capacitor structures. Alternatively, the third conductive layer 570 can connect the outer conductive layer 540 of the neighbor capacitor structures.

In some embodiments, methods to form devices having a high dielectric constant material can be provided. The methods can include forming capacitor structures having an outer surrounding electrode and an inner electrode, together with a dielectric layer having a preferred orientation to maximize the capacitance of the capacitor structure.

FIG. 6 illustrates a flowchart for forming a device according to some embodiments. Operation 600 forms a first dielectric layer over a substrate, wherein the first dielectric layer comprises a dominant crystallography orientation along a lateral direction. Operation 610 patterns the first dielectric layer to form a trench having two parallel side surfaces, wherein the parallel side surfaces are perpendicular to the lateral direction. Operation 620 forms a first conductive layer in the trench, wherein one surface of the first conductive layer is in contact with the first dielectric layer, wherein the conductive layer comprises similar crystal structure and similar lattice constant as the first dielectric layer. Operation 630 forms a second dielectric layer in the trench, wherein one surface of the second dielectric layer is in contact with the first conductive layer, wherein the second dielectric layer comprises a same material as the first dielectric layer, wherein the second dielectric layer comprises a same crystallographic orientation as the first dielectric layer. Operation 640 forms a second conductive layer in the trench. Operation 650 forms a third conductive layer, wherein the third conductive layer is in contact with an opposite surface of the one surface of the first conductive layer.

In some embodiments, a $TiO_2$ nanorod seed layer having tetragonal [001] direction can be formed on a substrate. A first $TiO_2$ layer can be deposited on the seed layer, thus having the same crystallography orientation as the nanorod layer. A trench having two parallel side surfaces can be patterned on the dielectric layer. A first conductive layer can be formed in the trench, to be operable as a first electrode for a capacitor structure. The first conductive layer can include material having crystal structure and lattice parameters matching that of $TiO_2$, such as $RuO_2$, $MoO_2$, $VO_2$, $NbO_2$, $TaO_2$, $CrO_2$, $MnO_2$, $OsO_2$, $RhO_2$, $IrO_2$, $PtO_2$, or any combination thereof. A second $TiO_2$ dielectric layer can be formed in the trench and contacting the first conductive layer. The second dielectric layer can have the preferred orientation of the first dielectric layer, which is preserved and transferred through the first conductive layer. A second conductive layer can be formed in the trench and contacting the second dielectric layer, operable as a second electrode for the capacitor structure.

Nanorods of rutile $TiO_2$ can grow along [001] direction, because this minimizes the (001) facets with a very large surface energy and allows to maximize the area of (110) facets believed to have the minimal surface energy. As a result, when the nanorods align on the substrate, their tetragonal axes also become aligned in the same chosen direction. During crystallization of the subsequent layers of the film, the nanorods can serve as crystallization seeds, so that this chosen orientation will become the tetragonal axis of any crystallite in the film. Thus independent formation of crystallites with any other orientation will be suppressed by a nucleation barrier.

In some embodiments, the resulting film can contain a large number of high-quality crystallites with relatively high κ, such as $κ_∥$=170, along the chosen direction. The film can be separated by some amorphous material with lower κ. Since the fraction of the amorphous material can be small, and the device geometry can be patterned to provide the electric fields parallel to the tetragonal axis of the film, the dielectric constant relevant to the operation of such structures will be close to $κ_∥$=170.

In some embodiments, the seed layer can include nanorod materials that grow in a preferred direction. For example, nanorods of rutile $TiO_2$ can be fabricated to grow in a [001] direction, and then collected and arranged to form the seed layer with nanorods substantially arranged along the [001] direction.

Nanorods, such as $TiO_2$ nanorods, can be prepared on a separate substrate by standard techniques, e.g. hydrothermal growth on a seeded substrate. The nanorods can be separated from the separate substrate (e.g. by mechanical means) and can be kept as a collection of powdered or suspended nanorods. This collection can be processed to obtain nanorods having high aspect ratio and uniform dimension.

In some embodiments, the substrate can be prepared to accept the nanorods. For example, the substrate can be processed to form grooves along a desired direction on the surface. The nanorods, which have been grown on a seeded substrate as described above, can be poured on the grooved substrate. Mechanical agitation can be supplied to the substrate to distribute the nanorods to the grooves. The vibration can stop when the arrangement of the nanorods on the substrate reaches a steady state. For example, the nanorods can cover between 50 and 100% of the substrate surface. The vibration process can have a vibration amplitude in the order of the diameter of the nanorods, e.g., 0.5 to 1.5 times the diameter of the nanorods, which is about 30 to 300 nm. The vibration process can have a vibration frequency greater than $\sqrt{g/d}$, with g being the strength of the gravitational field (9.81 m/s² in MKS unit) and d being the nanorod diameter. The grooves can have a diameter between 0.5 and 3× of the nanorod diameter, such as between 1 and 3×, which is about 250 to 600 nm. The separation between the grooves (e.g. between the centers of two adjacent grooves) may be between 1 and 5× of the nanorod diameter, such as between 1.5 and 3×. The grooves can have a depth between 0.3 and 0.8× of the nanorod diameter, which is about 15 to 160 nm. The nanorod diameter here can refer to the average diameter of the utilized nanorods. The groove diameter here can refer to the largest lateral width of the groove feature and does not need to imply a circular cross-section profile, nor needs to refer to the radius of any cross-sectional profile features.

Figure 7A:
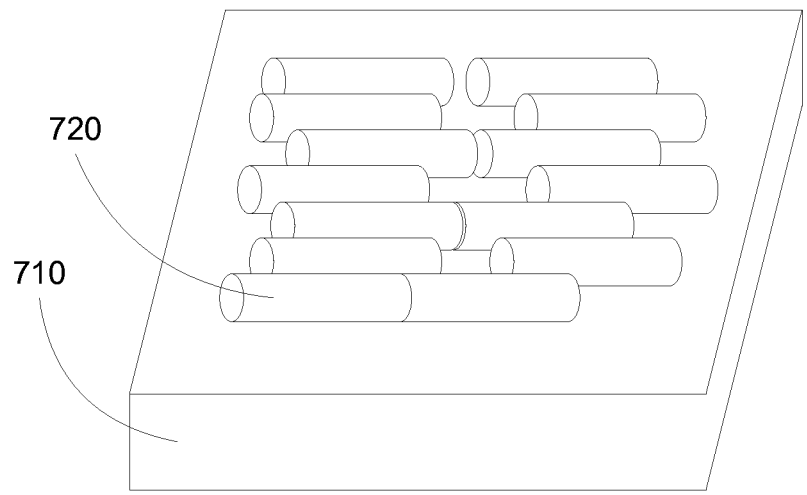
FIGS. 7A-7B illustrate nanorod configurations on a substrate according to some embodiments.
Figure 7B:
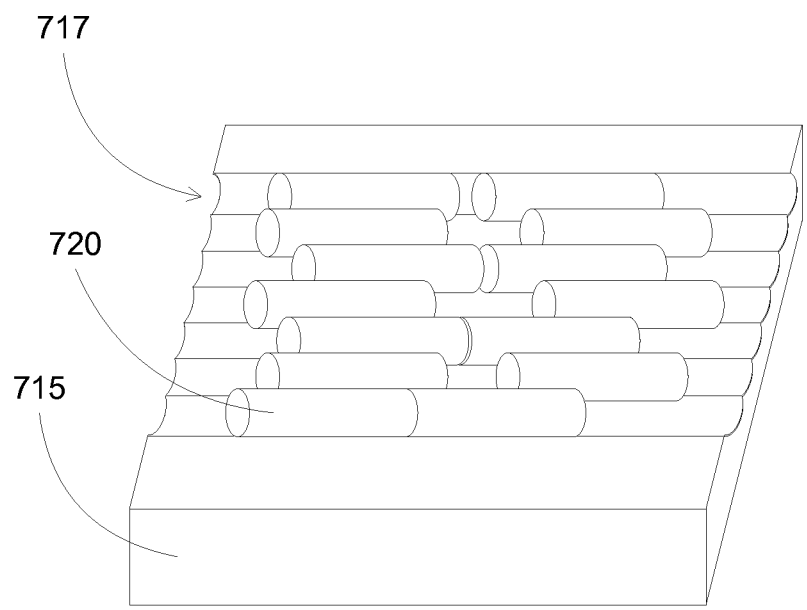

FIGS. 7A-7B illustrate nanorod configurations on a substrate according to some embodiments. In FIG. 7A, multiple nanorods 720 can be placed on a substrate 710. The nanorods are aligned, or substantially aligned, in a certain direction on the substrate surface. For example, the nanorods can be placed sideway on the substrate, with the nanorods placed next to each other and facing a same direction. In FIG. 7B, the substrate 715 can be grooved, e.g., grooves 717 can be formed on the surface of the substrate to facilitate the alignment of the nanorods.

In some embodiments, methods, and devices fabricated from the methods, to form high dielectric constant layer are disclosed. The materials used in the high dielectric constant layer can be anisotropic materials having different values of the dielectric constant in different crystal orientations. For example, the dielectric constant of rutile $TiO_2$ in the [001] direction can be about two times larger than that in other directions. By aligning the anisotropic materials so that the direction of high dielectric constant is placed along an applied electric field, the anisotropic materials can exhibit the high value of the dielectric constant.

As a specific example, $TiO_2$ nanorods can be placed on a substrate, with the high dielectric constant substantially aligned in a direction parallel to the substrate surface. $TiO_2$ then can be deposited on the nanorods to form a thicker layer of similar crystal orientation. For example, the deposited $TiO_2$ can be formed, e.g., via depositing and treating, under conditions to achieve similar crystal structure as the nanorods. The dielectric layer of $TiO_2$ can be deposited on a layer of $TiO_2$ nanorods, e.g., by a deposition technique such as atomic layer deposition (ALD) or chemical vapor deposition (CVD). The deposition process can use the nanorods as a crystallization seeds. After deposition, the deposited layer can be annealed, for example, between 300 and 450 C, to crystallize the materials in the deposited layer. Multiple sequences of deposition and annealing can be performed to grow a thicker film. For example, individual layers between 50 and 200 nm can be deposited and then annealed. The deposition/anneal sequence can be optimized to crystallize each newly deposited layer after each deposition/annealing sequence. For example, a single deposited layer of appropriate thickness can be annealed so that the annealing process does not lead to nucleation of new rutile seeds, but instead crystallizes the newly deposited $TiO_2$ materials using the previously-crystallized materials as a seed, so that all the crystallized $TiO_2$ material is structurally linked to the nanorods.

The dielectric layer can have a high dielectric constant along the direction of the length of the nanorods, e.g., along a direction parallel to the substrate surface. The dielectric layer can be patterned to expose a surface substantially perpendicular to the direction of high dielectric constant. The patterning process can be performed by a photolithography process, including masking a portion of the dielectric layer and etching away an undesired portion.

A conductive region can be formed in contact with the exposed surface of the dielectric layer. In some embodiments, two conductive regions can be formed, sandwiching the dielectric layer in the direction of high dielectric constant, e.g., the [001] direction that offers higher dielectric constant of $TiO_2$ material.

Figure 8A:
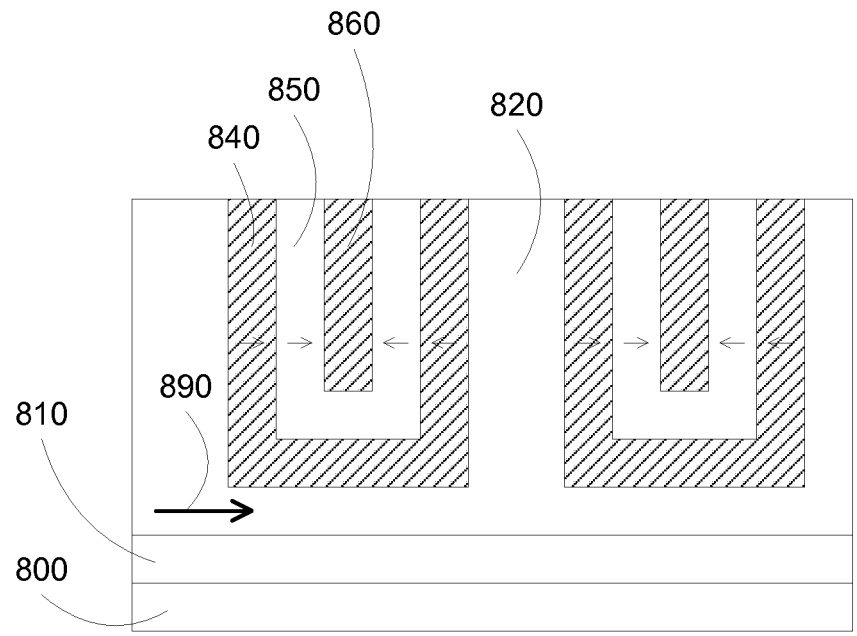
FIGS. 8A-8B illustrate capacitor configurations according to some embodiments.
Figure 8B:
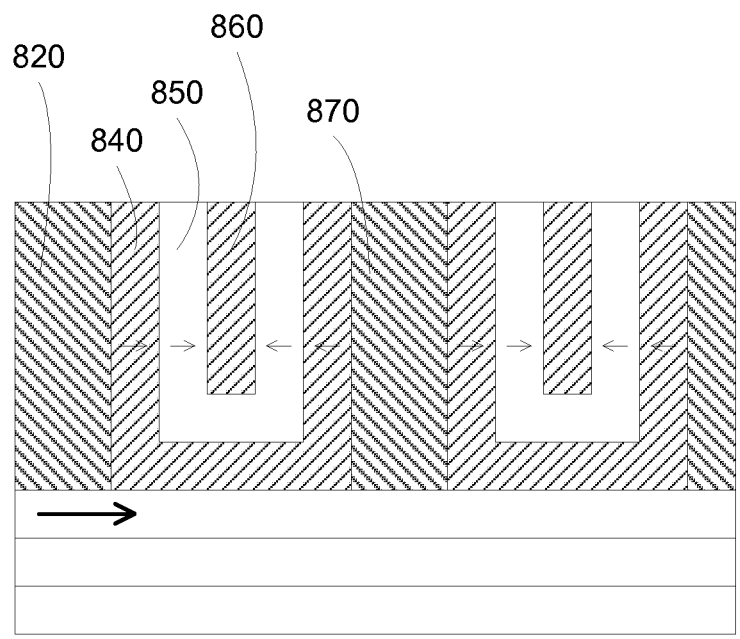

FIGS. 8A-8B illustrate capacitor configurations according to some embodiments. In FIG. 8A, a nanorod layer 810 can be formed on a substrate 800. A dielectric layer 820 can be formed on the nanorod layer 810, having the same preferred crystallography orientation 890 as the nanorod layer 810. A capacitor structure can have an outer electrode 840 and an inner electrode 860, sandwiching the dielectric layer 850. The dielectric 850 can have the same preferred crystallography orientation 890 to maximize the capacitance value.

In FIG. 8B, an optional conductive layer 870 can be formed near the outer electrodes 840, for example, to increase the conductivity of the conductive layer 840. The optional conductive layer 870 can connect the outer conductive layer 840 of the neighbor capacitor structures.

In some embodiments, methods to form devices having a high dielectric constant material can be provided. The methods can include forming a $TiO_2$ layer on a $TiO_2$ nanorod seed layer, and then patterning the $TiO_2$ layer to expose a surface having high dielectric constant. The $TiO_2$ layer can be annealed to achieve a same crystallinity as the seed layer. Electrodes can be formed in contact with the exposed surface to form a device exploiting the high dielectric constant characteristic of the $TiO_2$ layer.

FIG. 9 illustrates a flowchart for forming a device according to some embodiments. In operation 900, a layer of $TiO_2$ nanorods can be formed on the substrate. The nanorods can be aligned in a direction parallel to the substrate surface. For example, the substrate can include multiple grooves to accommodate the nanorods. The substrate can also include other layers, such as a connecting layer.

In operation 910, a $TiO_2$ layer is formed on the nanorod seed layer. The $TiO_2$ layer can be formed by one or more sequences of deposition and anneal. For example, a $TiO_2$ layer can be deposited, such as by an ALD or a CVD process. The deposited $TiO_2$ layer can be annealed, for example, in temperatures between 300 and 450 C to recrystallize the deposited $TiO_2$ layer. The thickness of the $TiO_2$ layer can be less than 1000 nm, for example, between 50 and 500 nm. For thick $TiO_2$ layer, multiple sequences of deposition/anneal using thinner layers of $TiO_2$ can be used, for example, to facilitate the crystallization process. The thickness of the thin $TiO_2$ layer can be between 50 and 200 nm.

In operation 920, the $TiO_2$ layer can be patterned to form a trench having two parallel side surfaces. The side surface can be perpendicular, or substantially perpendicular, to the substrate surface or the $TiO_2$ layer top surface. The patterning process can be performed by a photolithography technique, including masking a desired portion of the $TiO_2$ layer, and etching away the unwanted portion.

Forming a first conductive layer in the trench, wherein one surface of the first conductive layer is in contact with the first dielectric layer, wherein the conductive layer comprises $VO_2$, $NbO_2$, $TaO_2$, $CrO_2$, $MoO_2$, $MnO_2$, $RuO_2$, $OsO_2$, $RhO_2$, $IrO_2$, $PtO_2$, or any combination thereof.

In operation 930, a first conductive layer is formed in the trench in contact with the exposed surfaces of the $TiO_2$ layer. The conductive layer can be operable as an electrode, generating an electric field perpendicular to the exposed surface, which can experience a high dielectric constant characteristic of the $TiO_2$ layer. The conductive materials can include $RuO_2$, $MoO_2$, $VO_2$, $NbO_2$, $TaO_2$, $CrO_2$, $MnO_2$, $OsO_2$, $RhO_2$, $IrO_2$, $PtO_2$, or any combination thereof. The electrodes can have any thickness, for example between about 5 nm and about 500 nm thick.

In operation 940, a second dielectric layer is formed in the trench, wherein one surface of the second dielectric layer is in contact with the first conductive layer, wherein the second dielectric layer comprises a same material as the first dielectric layer, wherein the second dielectric layer comprises a same crystallography orientation as the first dielectric layer.

In operation 950, a second conductive layer is formed in the trench. The second conductive layer can include doped polysilicon, metallic elements such as Pt, W, Ti, Al, metallic alloys, or conductive metal nitrides or oxides. The electrodes can have any thickness, for example between about 5 nm and about 500 nm thick.

In some embodiments, devices can be fabricated using the high dielectric constant layer. For example, a capacitor structure, including two conductive regions sandwiching the dielectric layer, can be formed as discussed above. Similarly, other devices can incorporate the high dielectric constant layer, such as a dynamic random access memory (DRAM) including a controlled transistor coupled to a capacitor. The high dielectric layer can be used as the vertical gate dielectric in a fin field effect transistor (finFET).

Figure 10:
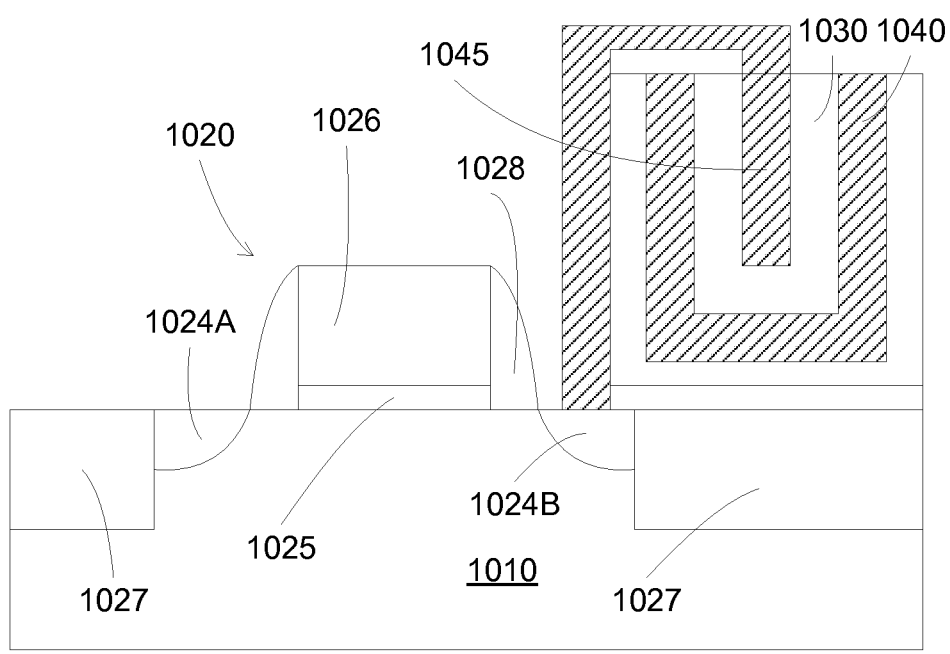
FIG. 10 illustrates an example of a memory cell according to some embodiments.

FIG. 10 illustrates an example of a memory cell according to some embodiments. A transistor structure 1020 is formed on a substrate 1010, including isolation regions 1027 to isolate the neighboring devices, source and drain regions 1024A and 1024B sandwiching a gate electrode having a gate dielectric 1025 and a gate conductor 1026. Spacers 1028 can cover the sidewalls of the gate electrode. The substrate can be a semiconductor substrate, or any substrates having a layer of semiconductor layer. For example, the substrate can be a single crystal silicon substrate. The substrate can be a silicon-germanium substrate, or can have a silicon germanium layer disposed on top. The substrate can also be a germanium substrate, or a silicon carbide substrate. The gate conductor can include doped polysilicon. A metal-oxide-semiconductor field effect transistor (MOSFET) structure is shown, but the invention is not so limited, and can include any transistor structure, such as bipolar transistors. In addition, the process flow can include a silicidation process for gate electrode and on source and drain regions. A capacitor device, including a vertical dielectric component 1030, sandwiched by two electrodes 1040 and 1045, can be connected to the drain 1024B (or source 1024A) of the transistor. The capacitor device can utilize the high k material as described above. The capacitor device is shown in direct contact with the transistor structure, but the invention is not so limited, and the capacitor device can be spatially separated from the transistor device and electrically connected to it by additional means, such as an additional interconnect structure.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a capacitor, the method comprising forming a seed layer;
   forming a first dielectric layer over the seed layer,
      wherein the first dielectric layer is formed with a first crystallographic orientation,
      wherein a thickness of the first dielectric layer is between 50 nm and 500 nm,
      wherein the first dielectric layer has an anisotropic dielectric constant property,
      wherein the anisotropic dielectric constant property is characterized as having a first dielectric constant value in a first crystallographic direction and a second dielectric constant value in a second crystallographic direction,
      wherein the first dielectric constant value is greater than the second dielectric constant value, and
      wherein the first crystallographic direction is parallel to a lateral surface of the first dielectric layer or perpendicular to the lateral surface of the first dielectric layer;
   forming a first conductive layer over the first dielectric layer;
   forming a second dielectric layer over the first conductive layer,
      wherein the composition of the second dielectric layer is the same as the composition of the first dielectric layer,
      wherein the second dielectric layer is formed with the first crystallographic orientation; and
   forming a second conductive layer over the second dielectric layer.

2. The method as in claim 1 wherein the first conductive layer comprises a crystal structure and lattice parameters that match at least 80% to the crystal structure and lattice parameters of the first dielectric layer.

3. The method as in claim 1 further comprising annealing the first dielectric layer before forming the first conductive layer.

4. The method as in claim 3 wherein the annealing is performed for less than 30 minutes at a temperature between 300 and 450 C.

5. The method as in claim 1 further comprising annealing the first conductive layer before forming the second dielectric layer.

6. The method as in claim 1 wherein the first crystallographic direction is perpendicular to the lateral surface of the first dielectric layer.

7. The method as in claim 1 wherein the first crystallographic direction is parallel to the lateral surface of the first dielectric layer.

8. The method as in claim 1 wherein the seed layer comprises titanium oxide nanorods.

9. The method as in claim 8 wherein forming the seed layer comprises forming a set of parallel grooves on a substrate, depositing the titanium oxide nanorods into the grooves, aligning the titanium oxide nanorods in the grooves by mechanical agitation.

10. The method as in claim 9 wherein each of the set of parallel grooves has a depth of between about 0.3 to 0.8 times a diameter of the titanium oxide nanorods.

11. The method as in claim 9 wherein groves in the set of parallel grooves have a separation distance of between about 1 to 5 times a diameter of the titanium oxide nanorods.

12. The method as in claim 1 wherein the first conductive layer vanadium oxide.

13. The method as in claim 1 wherein the first conductive layer niobium oxide.

14. The method as in claim 1 wherein the first conductive layer chromium oxide.

15. The method as in claim 1 wherein the first dielectric layer comprises titanium oxide.

16. The method as in claim 15 wherein titanium oxide of the first dielectric layer has a rutile structure.

17. The method as in claim 1 wherein the first conductive layer is formed within a trench in the first dielectric layer, and wherein the second dielectric layer is formed within the trench in the first conductive layer.

18. The method as in claim 17 wherein the second conductive layer is formed within the trench in the second dielectric layer.

19. The method as in claim 1 wherein the first conductive layer has a thickness of between about 1 nm and 30 nm.

20. The method as in claim 1 wherein the second dielectric layer has a thickness of between about 3 nm and 15 nm.

* * * * *